US006946355B2

(12) United States Patent
Behammer

(10) Patent No.: US 6,946,355 B2
(45) Date of Patent: Sep. 20, 2005

(54) METHOD FOR PRODUCING A HETERO-BIPOLAR TRANSISTOR AND HETERO-BIPOLAR TRANSISTOR

(75) Inventor: Dag Behammer, Ulm (DE)

(73) Assignee: United Monolithic Semiconductors GmbH, Ulm (DE)

(*) Notice: Subject to any disclaimer, the term of this patent is extended or adjusted under 35 U.S.C. 154(b) by 0 days.

(21) Appl. No.: 10/486,531

(22) PCT Filed: May 30, 2003

(86) PCT No.: PCT/EP03/05658

§ 371 (c)(1), (2), (4) Date: Feb. 10, 2004

(87) PCT Pub. No.: WO03/105211

PCT Pub. Date: Dec. 18, 2003

(65) Prior Publication Data

US 2004/0175895 A1 Sep. 9, 2004

(30) Foreign Application Priority Data

Jun. 10, 2002 (DE) ........................................ 102 25 525

(51) Int. Cl.[7] ............................................ H01L 21/8222
(52) U.S. Cl. ........................................ 438/312; 438/319
(58) Field of Search ................................ 438/309–350, 438/602–606

(56) References Cited

U.S. PATENT DOCUMENTS

| | | | | |
|---|---|---|---|---|
| 5,298,439 A | | 3/1994 | Liu et al. | |
| 5,324,671 A | * | 6/1994 | Bayraktaroglu | 438/170 |
| 5,668,388 A | | 9/1997 | Delage et al. | |
| 5,668,988 A | | 9/1997 | Chen et al. | |
| 5,682,046 A | | 10/1997 | Takahashi et al. | |
| 5,767,540 A | | 6/1998 | Shimizu | |
| 6,368,929 B1 | | 4/2002 | Hill et al. | |
| 6,395,608 B2 | | 5/2002 | Shin et al. | |
| 2001/0005025 A1 | | 6/2001 | Shin et al. | |
| 2002/0031892 A1 | | 3/2002 | Delage et al. | |
| 2002/0053683 A1 | | 5/2002 | Abrokwah et al. | |

FOREIGN PATENT DOCUMENTS

| | | |
|---|---|---|
| DE | 102 25 525 | 12/2003 |
| EP | 0480803 | 4/1992 |
| EP | 0480803 | 8/1998 |
| JP | 10321642 | 12/1998 |
| JP | 10321643 | 12/1998 |
| JP | 2000174301 | 6/2000 |
| JP | 2001326229 | 11/2001 |
| WO | WO 0209189 | 1/2002 |

OTHER PUBLICATIONS

IEEE Device Letters, vol. 17, No. 12, p. 555–556 (to follow), Dec. 1996.

* cited by examiner

*Primary Examiner*—H. Jey Tsai
(74) *Attorney, Agent, or Firm*—Collard & Roe, P.C.

(57) ABSTRACT

A hetero-bipolar transistor on Ga—As basis which has an advantageous design and to a method for producing the same which allows production of inexpensive and long-term stable components.

9 Claims, 4 Drawing Sheets

METHOD FOR PRODUCING A HETERO-BIPOLAR TRANSISTOR AND HETERO-BIPOLAR TRANSISTOR

CROSS REFERENCE TO RELATED APPLICATIONS

Figure 1A:

Applicant claims priority under 35 U.S.C. §119 of German Application No. 102 25 525.3 filed on Jun. 10, 2002. Applicant also claims priority under 35 U.S.C. §365 of PCT/EP03/05658 filed on MAY 30, 2003. The international application under PCT article 21(2) was not published in English.

The invention relates to a method for the production of a hetero-bipolar transistor, as well as to a hetero-bipolar transistor.

Hetero-bipolar transistors (HBTs), particularly in composite semiconductor materials based on GaAs, typically have a relief structure with an emitter shape designated as a mesa, over a base layer, whereby the contacts for controlling the base are spaced laterally at a distance from the emitter mesa structure.

It is known that the long-term stability of the component properties, particularly the current amplification, can be significantly improved by means of passivation of the semiconductor surface of the base layer, between the base contacts and the emitter mesa, using a semiconductor material that has been made to be weaker for carrying charges. Such a passivation layer is referred to as a ledge, both for HBTs in general and also in the following. In this connection, the ledge generally consists of emitter semiconductor material, and typically has a low layer thickness; in the case of an emitter composed of several semiconductor layers, it consists at least of the material of the emitter layer that immediately follows the base layer.

A method is known, for example, from U.S. Pat. No. 5,298,439, in which a lithographically structured metallic emitter contact serves as a mask for ion-reactive anisotropic etching of the emitter mesa, whereby a thin residual layer of the emitter semiconductor material InGaP having a thickness of approximately 70 nm is left on the base layer, which consists of GaAs, to the side of the emitter mesa. In further lithographic steps, the structure of the ledge is defined in this residual layer, whereby ion-reactive etching methods (RIE) are used once again.

U.S. Pat. No. 5,668,388 describes a particularly advantageous layer structure for the emitter of an HBT on GaAs, which takes advantage of the highly selective etchability between GaAs and InGaP in a layer sequence having several GaAs layers and several InGaP layers. In particular, a first emitter layer of InGaP having a layer thickness of approximately 30 nm is deposited on the GaAs base layer, and this is covered by a GaAs layer having a thickness of only 5 nm, and then additional InGaP and GaAs layers. In a first step, the mesa structure is etched using an emitter metal contact structured previously as an etching mask, down to the very thin GaAs layer, whereby slight under-etching of the semiconductor layers under the contact metal layer occurs. Subsequently, the lateral structure of the ledge is defined in a photoresist layer that is applied over the entire surface, and the thin GaAs layer and the InGaP emitter layer are etched away in the regions not protected by the photoresist.

A similar layer sequence with alternating GaAs and InGaP layers is used as the basis in IEEE Device Letters, Vol. 17, No. 12, p. 555–556, in order to etch the semiconductor layers of the emitter back laterally under the metallic emitter contact, by means of the alternating use of selective etching agents, using wet chemistry, whereby a ledge and an emitter mesa that is etched back further laterally, relative to the former, are formed under the masking metallic emitter contact. In this connection, particular advantage is taken of the fact that GaAs also forms a lateral etch stop for an enclosed InGaP layer. In this method, the ledge is aligned relative to the emitter, in self-adjusting manner, without any additional lithography steps, whereby the adjustment of the lateral dimensions causes problems because of the wet-chemical etching processes that are repeatedly used. The metallic emitter contact serves, at the same time, as a mask for subsequent vapor deposition of contact metal for the base contact. A self-adjusting alignment of the emitter contact and the base contacts of an HBT is also known from EP 0 480 803 B1, where a defined distance between the emitter mesa and the base contacts is adjusted by means of lateral spacers on an emitter mesa. A lateral indentation in the spacer layers prevents short-circuits between the emitter contact and the base contact.

The present invention is based on the task of indicating a method for the production of an HBT (or a comparably structured component) as well as an HBT particularly produced according to such a method, having particularly good long-term stability of the component properties.

Solutions according to the invention are described in the independent claims. The dependent claims contain advantageous embodiments and further developments of the invention.

The method according to the invention, with early deposition of a passivation layer, results in advantageous component properties, in that the passivation layer deposited on the ledge reliably prevents damage to the ledge layer, i.e. the interface of the ledge to the base layer in subsequent process steps. The passivation layer is structured and, with this structure, serves as a mask for subsequent etching of the ledge. In this connection, it is advantageous if this etching of the ledge is carried out using a gentle isotropic, particularly wet-chemical etching method, so that damage to the base layer that is exposed in this process can be precluded. It turns out that HBT components produced in this manner have a very good long-term stability of the electric component properties, in reproducible manner. The passivation layer preferably remains on the ledge permanently, so that the latter is reliably protected against damage during subsequent process steps.

It is advantageous to deposit nitride, particularly $Si_3N_4$, on the ledge layer, i.e. in the case of a particularly advantageous combination of the first emitter layer with a semiconductor etch stop layer for the ledge region that covers the former and can be selectively etched relative to it, on this etch stop layer. Nitride adheres very well to the semiconductor surface, so that no gap formation between the semiconductor layer and the passivation layer occurs, which could result in uncontrolled and/or non-uniform etching of the ledge under the passivation layer. The passivation layer can also consist of different materials, preferably materials deposited in partial layers, one after the other, for example in order to achieve more rapid layer growth, for example of nitride and oxide, whereby preferably the material that adheres better to the semiconductor material, which is nitride in the example, is deposited first, i.e. directly on the semiconductor surface.

It is advantageous if the passivation layer is also deposited on the vertical flanks of the mesa, for example in an essentially isotropic process such as gas phase deposition CVD, so that the structure of the mesa remains uninfluenced by the etching of the ledge layer, which is gentle on crystals and is wet-chemical etching, in particular, and by the subsequent process steps.

Structuring of the passivation layer can take place, in a first embodiment, using a mask produced by means of photolithography which, at the same time, can serve as a mask for producing metallic base contacts in a lift-off process. Preferably, however, a cover layer of the emitter mesa, which particularly also serves as a first mask for the structuring of the emitter mesa in a prior step, is used as a second mask or as the basis for the second mask for structuring of the passivation layer. The use of the cover layer as a mask for structuring the passivation layer, which in turn masks the etching of the ledge, has the result that the semiconductor emitter mesa has a lateral indentation under the cover layer, which essentially possesses the lateral dimension of the ledge. The use of the structured cover layer for the first and the second mask results in a particularly symmetrical and/or uniform and precisely adjustable sizing of the ledge, because of the self-adjusting alignment when using an essentially anisotropic etching method, which proves to be particularly advantageous for the long-term stability properties of the components produced in this manner. According to an advantageous further development, the space surrounded on several sides by the cover layer, the semiconductor emitter mesa, and the ledge, is permanently filled up with a defined dielectric, particularly a polymer, preferably BCB (benzocyclobutene), in order to prevent uncontrolled deposition of materials from subsequent process steps.

A metallic emitter contact can serve as the cover layer, in a manner actually known from the state of the art, particularly in the embodiment having a second photolithography mask. Preferably, however, the cover layer is not formed by the metallic emitter contact, but rather by a dielectric layer deposited on the latter, preferably an oxide, which remains essentially uninfluenced by the subsequent etching steps, after the initial structuring. The dielectric cover layer allows the production of a lateral indentation by means of under-etching, with particularly great precision, by means of selective etching of the metallic emitter contact layer and the structuring of the emitter semiconductor layers with essentially the lateral structures of the metallic contact, which is then only under-etched slightly in the semiconductor layers. For this purpose, electrochemical influences of the cover layers, which offer only the side flanks as contact surfaces for a wet-chemical etching agent, are minimized, for one thing. For another thing, as a result of the automatic slow-down of the etching rate of the emitter semiconductor layers when the lateral structures of the emitter contact that serves as the etching mask for the emitter semiconductor layers, in this regard, when these are etched, preferably by means of wet-chemical etching, are reached, further under-etching of the lateral structure of the metallic contact in the emitter semiconductor layers can be kept very low, so that variations of the lateral structure of the emitter semiconductor layers due to an insufficiently controllable etching rate or, in particular, due to a crystalline-dependent etching rate, can be prevented or kept low, to a great extent, and the lateral indentation determined by the under-etching of the dielectric cover layer in the metallic contact layer and therefore also the lateral expanse of the ledge away from the emitter mesa can be precisely adjusted. Depending on the layer structure of the emitter, it can be advantageous to deposit a protective layer in an intermediate step, particularly after the emitter semiconductor mesa has been completed, to a great extent, which layer protects the structure that has already been etched from the renewed effects of the etching agent during subsequent steps, and can be removed again before deposition of the passivation layer. In an advantageous embodiment, such a protective layer can be produced without additional masking.

In the following, the invention will be explained in greater detail, using preferred exemplary embodiments, making reference to the figures. These show:

FIG. 1 a first advantageous method sequence,

FIG. 2 a preferred method sequence,

FIG. 3 another advantageous method sequence.

Figure 1B:
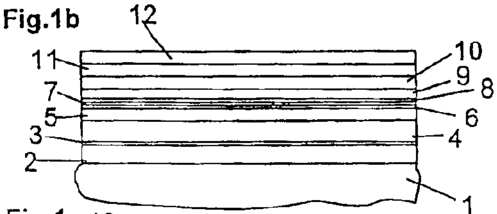
Figure 1C:
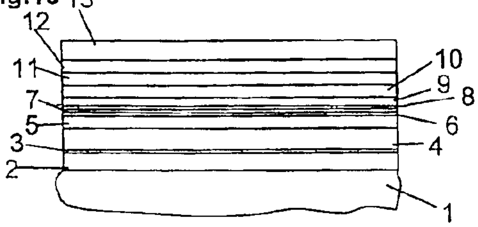
Figure 1D:
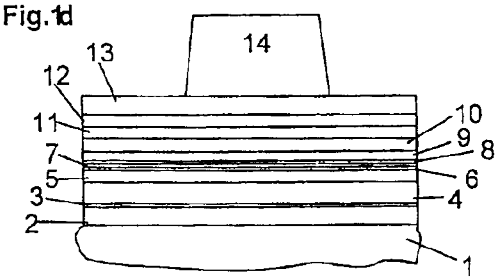
Figure 1E:
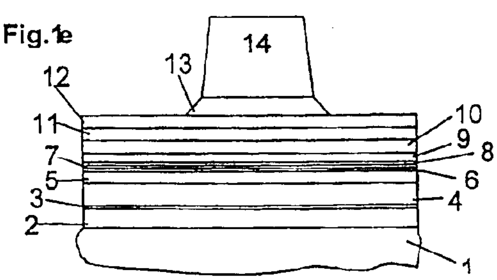
Figure 1F:
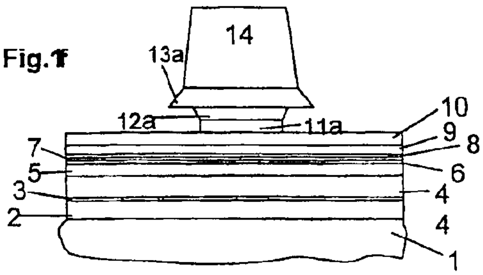
Figure 1G:
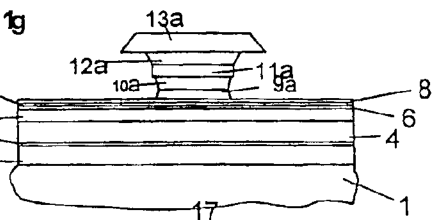

In the following description of the exemplary embodiments, the point of departure is a particularly advantageous layer sequence, which is also already indicated in the document U.S. Pat. No. 5,668,388 that was mentioned initially. In this connection, the semiconductor layers 2 to 10 form the vertical profile of an HBT on the GaAs substrate 1, whereby 2 represents the highly doped subcollector, 3 represents an InGaP stop layer, 4 represents the collector having a low doping, 5 represents the base, 6 represents the InGaP emitter, 7 represents a very thin GaAs stop layer, 8 represents an InGaP stop layer, which can also be used as a ballast resistor at an increased thickness, 9 and 10 represent the GaAs/InGaAs emitter contact, which ends in 10 with a highly doped InGaAs layer (FIG. 1*a*). After wet-chemical pretreatment, the metallic contact layer 11 and the contact reinforcement 12, which is also metallic, are applied (FIG. 1*b*). Preferably sputtered diffusion barriers such as WTlN, WSiN, TaN, or WTiSlN are used. The double layer consisting of 11 and 12 should have a slight mechanical bias, possess good adhesion properties on InGaAs, and can preferably be structured in a plasma based on fluorine. After deposition of the oxide layer 13, the production of a first mask structure 13*a* in this oxide layer takes place by means of the resist mask 14 (FIG. 1*c, d*), which structure subsequently masks the etching of the metal layers 12 and 11 (FIG. 1*e, f*). As a result of the lateral etching rates of the layers 11–13, which differ as a function of the etching parameters, with low lateral removal of the oxide 13*a*, the overhung structure shown in FIG. 1*f* is formed. The lateral etching of the metallic layers 11 and 12 is independent of direction and can be well controlled, so that the dimension of under-etching can be precisely adjusted. After the photoresist is removed, the semiconductor emitter mesa in the layers 9 and 10 is structured, preferably by a wet-chemical process (FIG. 1*g*). In this connection, the metal layers 11*a*, 12*a* remain essentially unchanged. This etching process takes place selectively with regard to the InGaP layer 8, which is retained over its entire area. In the case of the wet-chemical etching of the semiconductor layers 9 and 10, the etching preferably proceeds significantly more rapidly perpendicular to the layer plane than in the layer plane, in known manner. Here, complete etching of the layers 9 and 10 in regions not covered by the metal layer 11 can be reliably achieved by means of a predetermined time and/or optical observation of the etching progress and, at the same time, it can be guaranteed that the semiconductor layers 9, 10 show only a slight further under-etching of the metal layer 11 and essentially follow the precisely adjustable lateral structure of the latter.

Figure 1H:
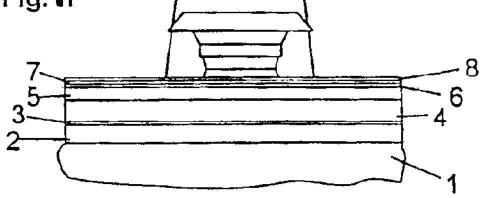
Figure 1I:
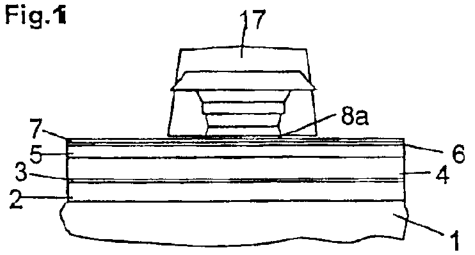
Figure 1J:
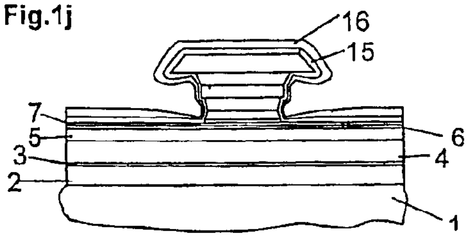
Figure 1K:
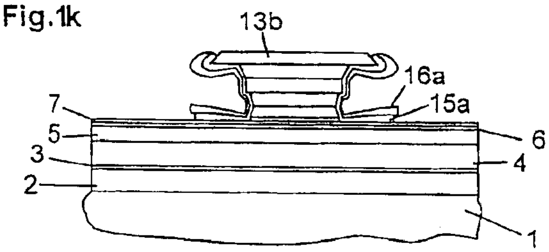
Figure 1L:
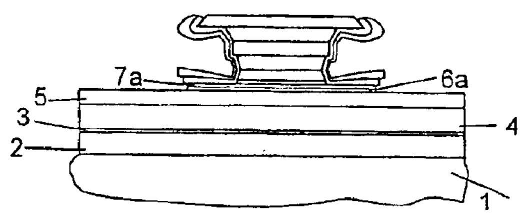

The flanks of the layers 9*a* and 10*a* of the emitter mesa, which have been etched up to that point, are protected from lateral etching attack by means of a photoresist mask 17 in FIG. 1*h*, the lateral dimensions of which are not critical. Subsequently, the InGaP layer 8 is etched using a wet-chemical process, e.g. in HCl, selectively with regard to the GaAs layers 7 and 9*a*, whereby the lateral under-etching in the case of the InGaP etching is very high and the protection layer 17 is greatly under-etched. The lateral removal of the layer 8 automatically stops at the GaAs layer 9*a* (FIG. 1*i*), however, in known manner. After removal of the photoresist 17, a double layer consisting of SlN and $SiO_2$ (15, 16) is applied isotropically, preferably in a plasma deposition process (FIG. 1*j*). This double layer is removed in an anisotropic etching process, with the cover layer structure 13*b* as a mask, which layer is laterally broadened by the passivation layer 15, 16, whereby no removal takes place under the overhang of 13*b*, so that the lateral structure indicated as 15*a*, 16*a* is formed in the double layer 15, 16, above the semiconductor layers 6, 7, the progression of which structure is essentially dependent on the shape of the oxide mask 13*a* with the broadened regions resulting from the passivation layer 15, 16. By means of weakening the anisotropism of this etching towards the end of the etching process, a slight undercut of the oxide layer 16*a* in the nitride layer 15*a* that lies underneath it can occur. The GaAs layer 7 acts as a vertical etch stop. Subsequently, the structure of 7*a* and 6*a* is etched from 6 and 7 (FIG. 11), using the known methods for wet-chemical etching of GaAs and InGaP. The etching preferably takes place selectively, in two steps, whereby the GaAs layer 7 is removed in a first step, and an undercutting of the mask 15*a* remains slight, because of the very slight thickness of that layer. The etching of the InGaP layer 8 preferably takes place by means of HCl, so that the GaAs layer 7*a* again acts as a lateral etch stop. The emitter is now in the region of 8*a*, while the region outside of that is defined as a ledge. The ledge having semiconductor layers 6*a*, 7*a* has a very uniform lateral expanse relative to the mesa, as a result of this self-adjusting production, relative to the emitter mesa, which expanse is primarily determined by the initial under-etching of the oxide mask 13*a* in the production of the mesa.

Figure 2A:
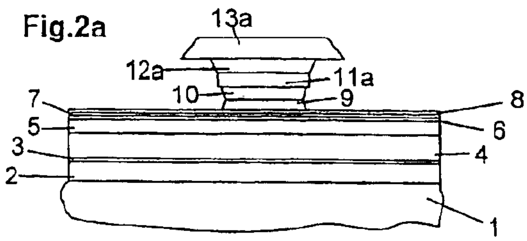
Figure 2B:
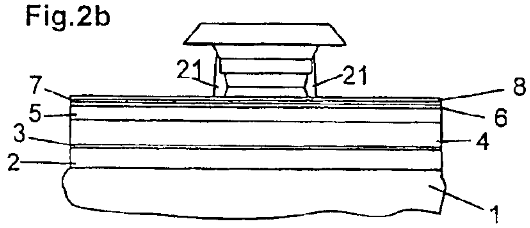
Figure 2C:
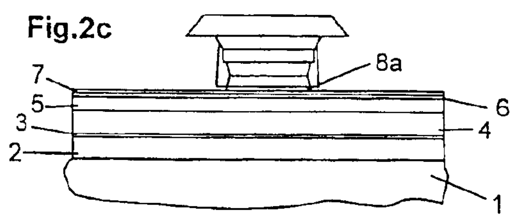
Figure 2D:
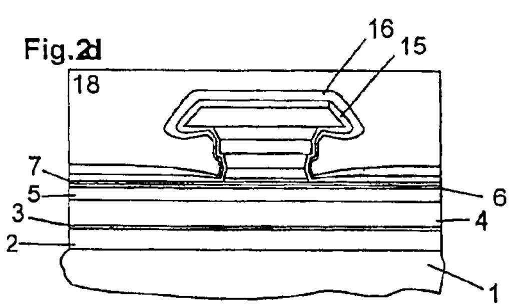
Figure 2E:
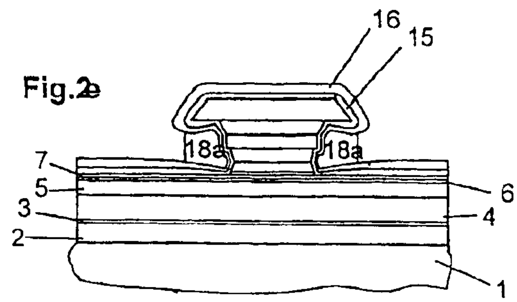
Figure 2F:
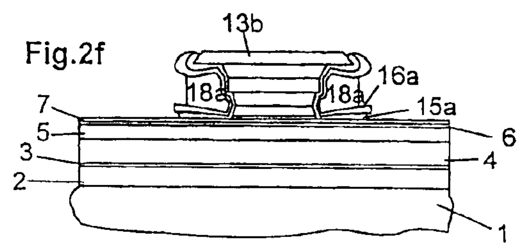
Figure 2G:
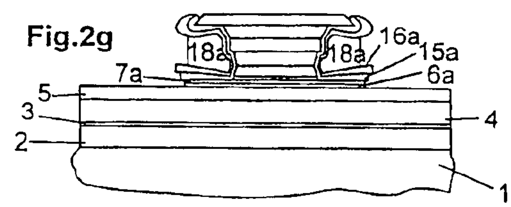

FIG. 2*a* starts from the process stage of FIG. 1*g*. The photoresist layer 17 shown in FIGS. 1*h* and 1*i* is replaced, in FIG. 2*b*, with the photoresist spacer pieces 21 that are produced in self-adjusting manner, as the protective layer. For this purpose, the photoresist is applied over the entire area and exposed by means of flood exposure. The oxide mask 13*a* is transparent for this exposure. By means of the metal layers 11*a* and 12*a* that overhang relative to the semiconductor layers 9*a* and 10*a*, protection against the exposure of the photoresist exists at the flanks of 9*a* and 10*a*, and after development, this has the result that the photoresist remains on these flanks as a protective layer (FIG. 2*b*). The photoresist spacer pieces 21 protect the InGaAs contact layer 10*a* from a lateral attack of the concentrated HCl during the subsequent etching of the InGaP layer 8 (FIG. 2*c*). The further process sequence corresponds to the above exemplary embodiment. The masking of a protective layer that covers the semiconductor layers 9*a*, 10*a*, here the photoresist layer 21, by means of the metallic contact layer, is generally particularly advantageous for the production of a protective layer at lateral flanks of an emitter mesa.

In addition, it can be provided, after deposition of the double layer 15, 16 as a passivation layer, to permanently fill the cavity surrounded on several sides by the masking structure 13*a*, the mesa layers 8 to 12, and the base layer, i.e. the layers deposited on the latter, in defined manner, with a dielectric, preferably the temperature-stable polymer BCB (benzocyclobutene). BCB is spun on, for example, in liquid form, solidified at an elevated temperature, planarized (18 in FIG. 2*d*), and removed again by means of etching outside of the cavity, so that a permanent filling 18*a* of BCB remains. By means of filling the cavity, which step can also be inserted into the process sequence according to FIG. 1, it is guaranteed that no resist or chemical residues, which might influence the component properties, remain in this region during later process steps.

Figure 3A:
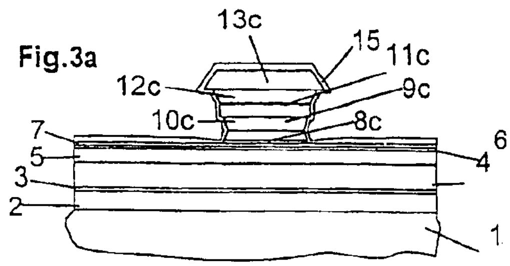

In the exemplary embodiment according to FIG. 3, in deviation from the previous exemplary embodiment, the oxide layer 13 is structured into the shape 13*c*, only slightly larger than the planned lateral dimension of the emitter semiconductor mesa, and under-etched in the metallic layers 12*c*, 11*c* as well as the semiconductor layers 10*c*, 9*c*, and 8*c* with only a slight lateral indentation, as illustrated in FIG. 3*a*.

A passivation layer 15, preferably again consisting of nitride, is applied over the entire area of this mesa structure as well as the layer 7 that is exposed in this connection. A photoresist mask 19 produced by means of photolithography, which encloses the emitter mesa as a second mask with lateral over-extension, is transferred into the passivation layer 15 as a structure 15*c*, by means of an anisotropic etching method (FIG. 3*b*).

As in the other exemplary embodiments, the structure 15*c* of the passivation layer serves as a mask for producing the ledge 6*c*, 7*c* in the semiconductor layers 6 and 7. In this exemplary embodiment, the ledge structure is not self-adjusting relative to the emitter mesa (FIG. 3*c*).

Figure 3D:
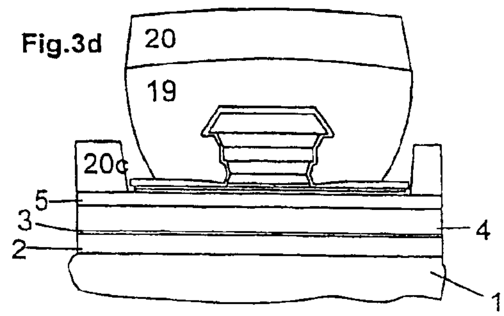
Figure 3B:
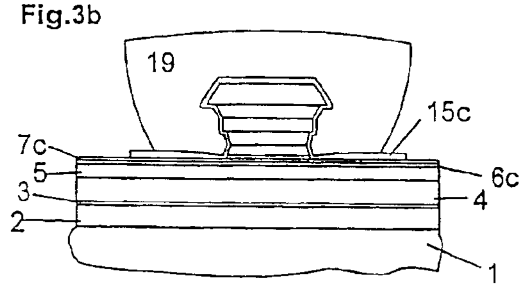
Figure 3E:
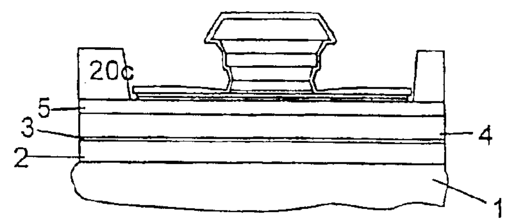
Figure 3C:
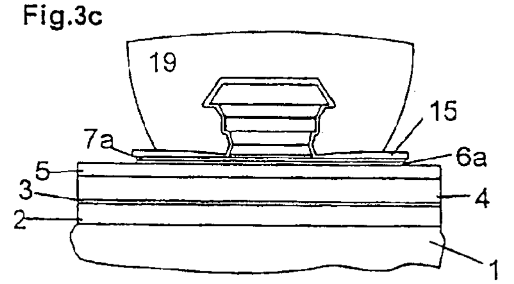

A metal layer 20 is deposited over the entire area of the structure according to FIG. 3*c*, in which the photoresist mask 19 continues to exist unchanged, and the base layer 5 is exposed outside of the ledge, which layer forms the metallic base contacts 20*c* on the semiconductor layer 5 (FIG. 3*d*). The base contacts reach right up to the structure 15*c* of the passivation layer. The metal layer deposited on the photoresist mask 20 is removed in a lift-off process (FIG. 3*c*). For a clean lift-off process, the photoresist mask 19 has a slight overhang and side flanks that are drawn in, in a downward direction.

It is also advantageous if the structure 15*a* in the passivation layer moves back slightly relative to the vertical projection of the photoresist mask, which can be achieved by means of weakening the anisotropism during the etching of the passivation layer.

The characteristics indicated above and in the claims as well as evident from the figures can be advantageously implemented both individually and in various combinations. The invention is not restricted to the exemplary embodiments described, but rather can be modified in many different ways, within the scope of the ability of a person skilled in the art. In particular, different materials can be used, other than the ones indicated as examples. If different materials are selected, layers that are not needed in terms of their function can be eliminated, and other layers can be provided, in addition.

What is claimed is:

1. A method for the production of a hetero-bipolar transistor having an emitter composed of several layers in a mesa structure, and a ledge that projects laterally beyond the mesa structure comprising the steps of:

a) depositing a first emitter layer on a base layer, composed of a layer sequence of semiconductor layers deposited over an area;

b) covering said first emitter layer with a stop layer that can be etched;

c) depositing at least one metallic contact layer;

d) depositing at least one dielectric cover layer which serves in a structured manner as a first mask for producing the emitter mesa structure;

e) forming a metallic emitter contact in said at least one metallic contact layer by underetching said at least one dielectric cover layer;

f) etching of the emitter mesa structure up to said stop layer using a material selective etching process;

g) depositing at least one passivation layer;

h) structuring said at least one passivation layer using said at least one dielectric cover layer as a second mask for defining a ledge region;

i) etching a ledge, wherein said at least one passivation layer forms a third mask, and wherein said etching said ledge uses an isotropic etching method down to said base layer.

2. The method according to claim 1, wherein Si3N4, is deposited for said at least one passivation layer.

3. Method according to claim 1, wherein a first partial layer of Si3N4, and subsequently a second partial layer of a different dielectric, in the form of SiO2, is deposited for said at least one passivation layer.

4. Method according to claim 1, wherein said at least one passivation layer is also deposited on vertical flanks of the mesa structure.

5. Method according to claim 1, wherein said dielectric cover layer serves, at the same time, as a second mask for structuring said at least one passivation layer.

6. Method according to claim 1, wherein said at least one passivation layer is structured with a second mask produced in photolithographic manner.

7. Method according to claim 1, wherein said cover layer is in the form of a dielectric layer, and is made from SiO2, and is deposited on the contact metal of said emitter as a cover layer.

8. Method according to claim 1, wherein before structuring of said at least one passivation layer, the space enclosed by said dielectric cover layer, said emitter mesa structure, and said base layer, on several sides, are permanently filled with a dielectric polymer, in the form of BCB (benzocyclobutene).

9. Method according to claim 1, wherein the etched layers are laterally surrounded with a protective layer, in an intermediate step with a partially etched emitter mesa structure, which layer is removed again before deposition of said at least one passivation layer.

* * * * *